United States Patent
Yamamoto et al.

(10) Patent No.: US 6,827,867 B2
(45) Date of Patent: Dec. 7, 2004

(54) METHOD FOR MANUFACTURING PRINTED WIRING BOARD

(75) Inventors: Takuya Yamamoto, Ageo (JP); Takashi Kataoka, Ageo (JP); Yutaka Hirasawa, Ageo (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 0 days.

(21) Appl. No.: 09/855,382

(22) Filed: May 15, 2001

(65) Prior Publication Data

US 2001/0042732 A1 Nov. 22, 2001

(30) Foreign Application Priority Data

May 16, 2000 (JP) ........................................ 2000-143325

(51) Int. Cl.[7] ................................................ H01B 13/00
(52) U.S. Cl. .................... 216/13; 219/121.68; 174/250; 174/262
(58) Field of Search ...................... 216/13; 219/121.68; 174/250, 262

(56) References Cited

U.S. PATENT DOCUMENTS

| | | | |
|---|---|---|---|
| 5,263,243 A | * 11/1993 | Taneda et al. | 29/830 |
| 5,382,333 A | * 1/1995 | Ando et al. | 156/81 |
| 5,879,568 A | * 3/1999 | Urasaki et al. | 216/18 |
| 5,965,245 A | * 10/1999 | Okano et al. | 428/209 |
| 6,337,463 B1 | * 1/2002 | Gaku et al. | 219/121.7 |
| 6,372,113 B2 | * 4/2002 | Yates et al. | 205/111 |

FOREIGN PATENT DOCUMENTS

| | | | | |
|---|---|---|---|---|
| EP | 0996318 A2 | * | 4/2000 | H05K/3/38 |
| JP | 410075069 A | * | 3/1998 | H05K/3/46 |
| JP | 410335814 A | * | 12/1998 | H05K/3/42 |
| JP | 411266084 A | * | 9/1999 | H05K/3/46 |
| JP | 411346059 A | * | 12/1999 | H05K/3/46 |

* cited by examiner

*Primary Examiner*—Nadine Norton
*Assistant Examiner*—Shamim Ahmed
(74) *Attorney, Agent, or Firm*—Jenkens & Gilchrist

(57) ABSTRACT

A printed wiring board manufacturing method is provided which is so consitituted that when a carbon dioxide leaser is used to form holes such as via holes in a copper clad laminate, copper foils and resin layers may be processed at the same time, without having to perform an etching treatment on the cooper foil. Namely, a carbon dioxide laser is used to form recess portions such as via holes in a copper clad laminate, followed by plating to form interlayer electrical connections, forming etching resist layers, and exposing and developing the etching resist layers, thereby effecting a circuit etching treatment. In particular, the copper clad laminate is a laminate formed by using waved copper foils to form external copper foils.

4 Claims, 9 Drawing Sheets

(a) Manufacturing of copper clad laminate (b) Peeling of Carrier Foil (c) Laser Treatment for Forming Holes (d) Copper Plating for Forming Interlayer Electrical Connection (e) Forming Etching Resist Layers (f) Exposing and Developing the Etching Resist Layers (g) Copper Etching (h) Peering of Etching Resist Layers

METHOD FOR MANUFACTURING PRINTED WIRING BOARD

TECHNICAL FIELD

The present invention relates to a method for manufacturing a printed wiring board, which employs a carbon dioxide laser to form recess portions such as via holes in a copper clad laminate to produce the printed wiring board.

BACKGROUND ART

In recent years, with the widespread use of cellular phones, mobile tools, and notebook personal computers, there has been an increasing demand for products which are lightweight and compact and which have a high density mounting. For this reason, a printed wiring board installed into an electronic apparatus requires the formation of fine-pitch circuits.

A printed wiring board which is lightweight and compact requires producing a circuit board having a multi-layer structure and a high density. In order to ensure interlayer electrical connections through a multi-layer printed wiring board, a conventionally used method is to form a plurality of through holes passing through a substrate. On the other hand, in recent years, for the purpose of increasing the freedom of design multi-layer printed wiring boards, a commonly used method is to form via holes having a smaller diameter than that of the through holes, or other small diameter holes such as blind via holes (BVHs) and interstitial via holes (IVHs) which do not extend through an associated substrate board but extend to the surfaces of inner copper foil layers.

In order to form the small diameter holes such as the through holes and various via holes, a conventional method is to perform mechanical drilling on a printed wiring board so as to form a plurality of small diameter holes. With the use of such a drilling treatment, a plurality of printed wiring boards may be laminated one upon another so that they can be processed simultaneously by a single drilling operation. If multiple spindle drilling is employed, it is possible to more easily improve the productivity of the drilling treatment.

Furthermore, when the drilling treatment is performed to form small diameter holes, most of such holes have a diameter of 0.3 to 0.4 mm. However, with the progress of technology during recent years, a further improved drilling treatment has become possible which can drill holes having a diameter of 0.15 to 0.25 mm.

In addition, another drilling treatment has been considered which employs a carbide drill to form holes having a diameter of 0.1 to 0.05 mm. However, this drilling treatment has been found to have many problems which have to be technically solved. For example, drills used in such a drilling treatment have only a short useful life, and there are some printed wiring boards which cannot be easily cut by drilling.

On the other hand, in the present market, the speed with which electronic devices and electric apparatus have become more compact and lightweight has been high. As a result, the present situation requires a more remarkable progress in the drilling technique. Consequently, a laser processing technique has been put into practical use to form small diameter holes having a diameter of 0.1 mm or smaller.

In the case where a laser processing technique is used to form small diameter holes in a printed wiring board, initial irradiation using laser light is allowed to start from a resin substrate (first type laser abrasion), or is permitted to start from the surface of a copper foil which will later become a desired circuit (second type laser abrasion). At this time, since the surface of a copper foil has a certain brilliance and thus has the property of reflecting laser light, the second type laser abrasion is difficult.

In fact, it is almost impossible to perform the above second type laser abrasion on the surface of a copper foil having a certain brilliance. Here, the fact that a copper foil reflects laser light will cause a decrease in the initial laser light absorbing efficiency. As a result, the speed of forming the desired holes will be undesirably reduced, thus lowering the production efficiency. For this reason, in the case where the above mentioned second type laser abrasion is carried out to form the desired holes, it is necessary to first perform an etching treatment to remove an external copper layer from an area in which the holes are to be formed. In fact, this is the conformal mask method which has already been well-known.

In the above mentioned etching treatment, it is necessary to apply an etching resist. However, since it has been difficult to control the precision of the resist application, it has been also difficult to ensure high precision of the etching position in an area where holes are to be formed. As a result, there will be a positional deviation between land pad portions forming contact points of an inner copper foil circuit and via holes to be formed during the laser abrasion. In order to solve this problem, such a positional deviation has been taken into account so that the land pad portions of the inner copper foil circuit are usually designed to have a relatively large size. This, however, is extremely unfavorable for making an inner copper foil circuit having a fine structure.

Furthermore, different sorts of lasers will of course exhibit different hole formation performances during the hole formation process. Namely, although using YAG laser will not cause any problem in treating a copper foil layer, using a carbon dioxide will make it difficult to treat the copper foil, rendering it impossible to ensure a stable hole formation process. In view of this, there has been a demand for developing an improved method of manufacturing a printed wiring board, which method does not involve an etching treatment for treating copper foil, but is capable of simultaneously stabilizing both a copper foil and a resin layer, and thus treating them using a carbon dioxide laser.

SUMMARY OF THE INVENTION

In view of the above, the inventors of the present invention, as a result of hard and diligent researches, have accomplished an invention which is an improved method for manufacturing a printed wiring board, which method does not involve using the above mentioned conformal mask method for removing copper foil, but is capable of simultaneously treating both a copper foil and a resin layer by using a carbon dioxide laser. In the following, the present invention will be described in more detail.

In one aspect, the invention is a method for manufacturing a printed wiring board, wherein a carbon dioxide laser is used to form recess portions such as via holes in a copper clad laminate, followed by plating to form interlayer electrical connection, forming etching resist layers, and exposing and developing the etching resist layers, thereby effecting a circuit etching treatment, characterized in that the copper clad laminate is a laminate formed by using waved copper foils to form external copper foils.

Figure 1:
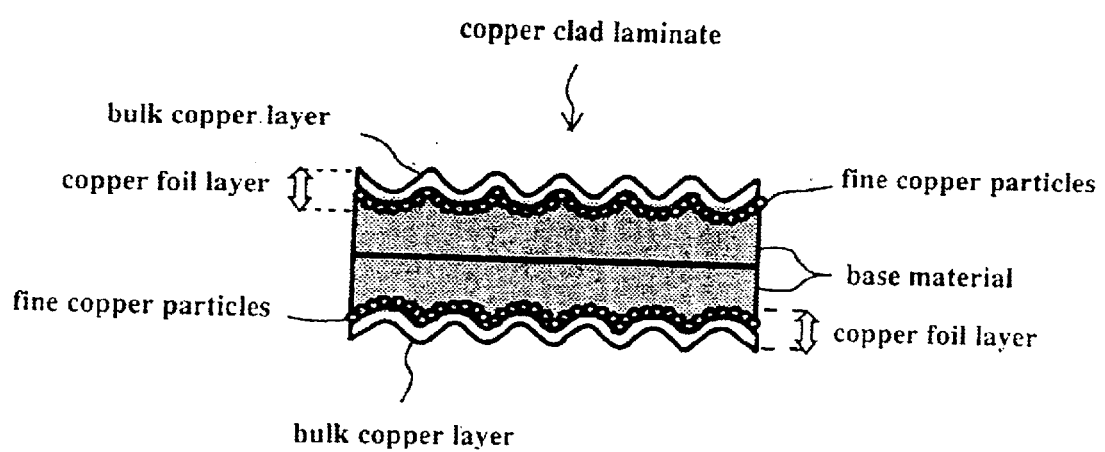
FIG. 1 is a schematic cross sectional view showing a copper clad laminate.
Figure 2:
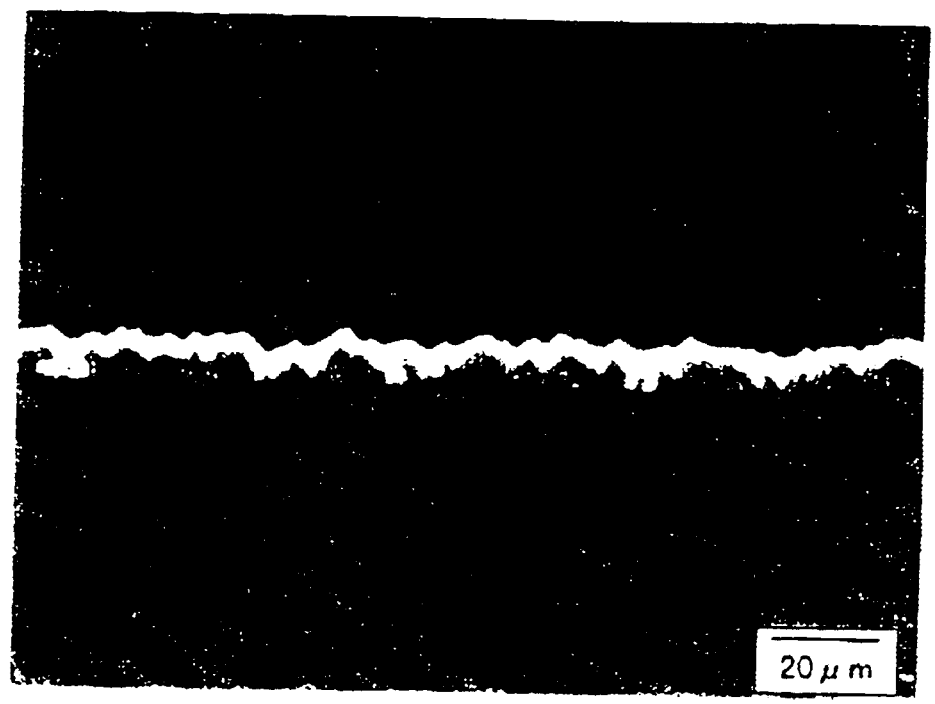
FIG. 2 is a photograph taken through an optical microscope, showing a cross section of the copper clad laminate.

The feature of this invention exists in the copper clad laminate. Such a copper clad laminate has external copper foil layers formed by using copper foils each having a wave-like shape or corrugated configuration. The wave-like shape, if defined more correctly, is shown in FIG. 1 which is a schematic cross sectional view showing the copper clad laminate. Namely, the bulk copper layers of the copper foil layers are formed in a corrugated configuration. A rust preventive layer is formed on one surface of each copper foil, or both surfaces of each copper foil may be formed with rust preventive layers, depending upon actual necessity. However, in the accompanying drawings serving as schematic views attached to the present specification, such rust preventive layers are omitted. FIG. 2 is a photograph showing an actual cross section of an external copper foil of a copper clad laminate used in the present invention, which cross section was viewed through an optical microscope. The copper foil layer shown in FIG. 2 is viewed in a manner different from that of the schematic view of FIG. 1 because both the bulk copper layers and the fine copper particles are all made of copper material. Therefore, interfaces between the copper layers and the copper particles are not clear, so that the wave-like shape of the bulk copper layers cannot be clearly seen in the photograph.

With regard to the printed wiring board manufacturing method according to the present invention, since the holes are formed by using a carbon dioxide laser, it is necessary to take into account the irradiation conditions when using the carbon dioxide laser, and the copper foils must be able to keep the shape of the waved bulk copper layers. In view of this, the copper foils for use in the copper clad laminate in the present invention have to be so formed that the thickness of each bulk layer is 18 $\mu$m or less. Here, the "thickness" does not mean a thickness value measured by a common gauge, but means a nominal thickness which is commonly used in dealing with a copper foil and is obtained by converting an area weight. In particular, with regard to the copper foils to be manufactured by an electrolytic method, the shape of the waves are required to be maintained properly in order to achieve a roughness range, Rz, of 2.0 to 20.0 $\mu$m. Further, although there is not any limitation to the lower limit of the thickness of the bulk copper layer, such a thickness may be about 1 $\mu$m so as to ensure uniformity and stability of precipitation when each bulk copper layer is formed by using the electrolytic method and to ensure high productivity and other desired efficiencies.

By forming the external copper foil layers each having the above described wave-like shape, it is possible to reduce the reflectance of the laser light. Here, reducing the reflectance of the laser light means an increase in the efficiency of obtaining heat energy from the laser light.

Figure 3:
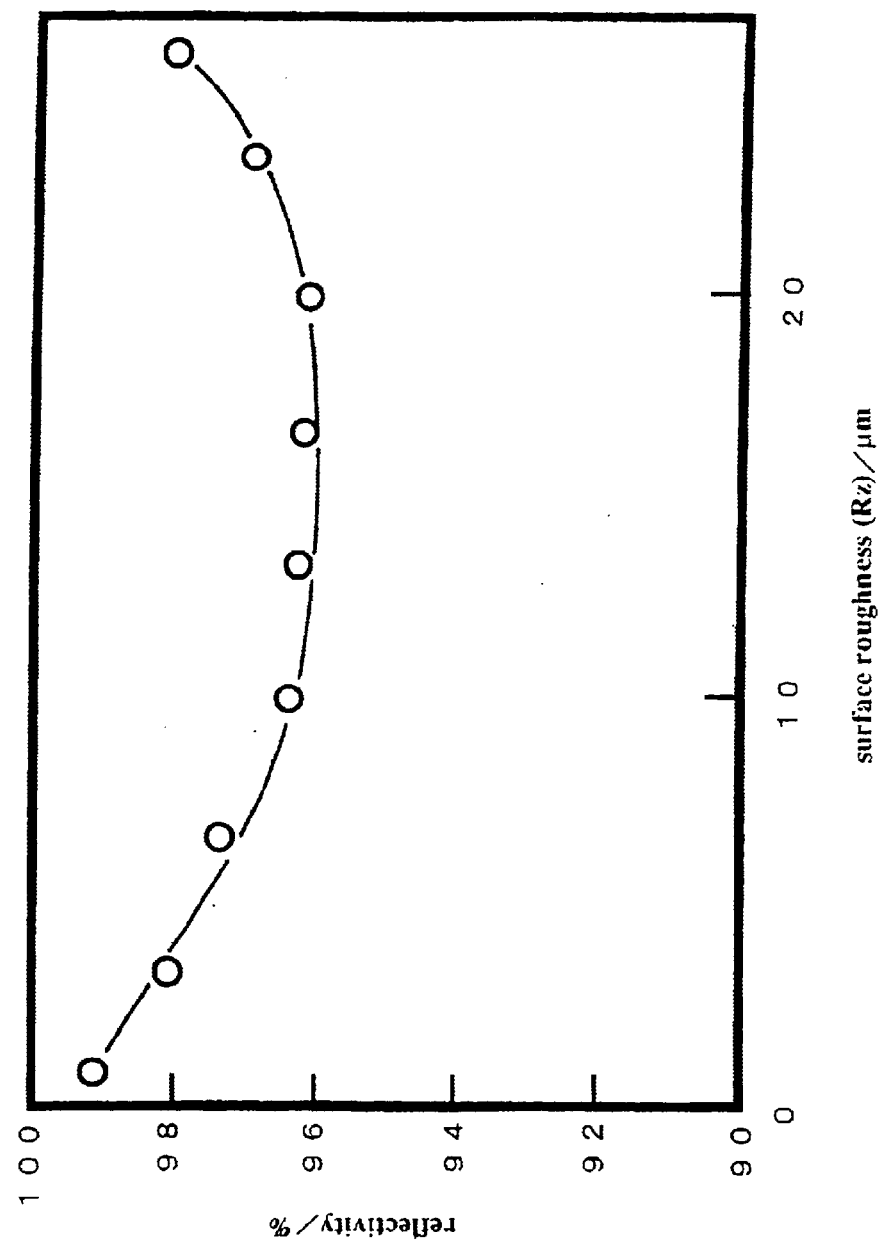
FIG. 3 is a graph showing a relationship between the reflectance of laser light and the roughness of a material surface.

Here, in order to analyze the effect obtainable by using the copper clad laminate having waved external copper foils, a graph is prepared and is shown in FIG. 3, which indicates a relationship between the surface roughness of the copper foils and the reflectance of the laser light. At this time, the conditions for the carbon dioxide laser irradiation may be set so that the frequency is 1000 Hz, the mask diameter is 5.0 mm, the pulse width is 60 $\mu$sec, the pulse energy is 16.0 mJ, the offset is 0.8, and the diameter of the laser beam is 140 $\mu$m, thereby ensuring the formation of holes of 110 $\mu$m in various copper clad laminates formed by using copper foils of different thicknesses. By setting the pulse energy at 16.0 mJ, it is possible for a lower energy to easily exhibit a workability difference when forming the holes using a laser light. Therefore, the inventors of the present invention have provided a judgement standard prescribing that if holes after laser abrasion have a diameter in a range of 100 to 110 $\mu$m, the result of the laser abrasion may be considered acceptable.

The surface roughness at this time is defined by using a matte side of an electrodeposited copper foil and then changing the roughness thereof. As may be clearly understood from FIG. 3, a higher value of the surface roughness (Rz) of a copper foil can cause laser light to have a lower reflectance. Namely, when compared with a smooth surface, a surface having more or less rugged portions is effective for increasing the absorption efficiency of laser light, thereby making it easy to increase the temperature of an area being irradiated by the laser light. This is because if a surface has rugged portions, laser light will produce an irregular reflection to a suitable extent, thereby making it possible to increase the efficiency in using the laser light.

In addition, as may be understood from FIG. 3, when the surface roughness Rz is larger than 20 $\mu$m, the reflectance of the laser light will be increased. This can be considered due to the use of an electrodeposited copper foil in a roughness measurement. In particular, the shape of a matte side of an electrodeposited copper foil is in a rugged state including mountain-like portions, so that a result will be that the rougher the matte side, the larger the size of each mountain-like portion. In such a case, the roughness measurement is conducted to measure only a surface having a large roughness. However, in order to minimize the reflectance of the laser light, it can be considered that a suitable irregularity range exists. For example, there is a roughness which is equal to the wavelength of the laser light, and such a roughness is said to be the most effective for minimizing the reflectance of the laser light.

The suitable irregularity range of a waved copper foil is within a range of 2.0 to 20.0 $\mu$m. If the surface roughness is less than the lower limit of 2.0 $\mu$m, it will be impossible to improve the workability when using laser light to form holes in a copper foil layer. On the other hand, if the surface roughness is larger than 20.0 $\mu$m, deterioration will begin to occur in the workability when laser light is used to form holes in a copper foil layer.

When the waved external copper foils used in the copper clad laminate in the present invention are irradiation with laser light, it is considered that the temperature will rise most rapidly in the front portions (tops of mountain-like portions) of waved areas. This is similar to the following phenomenon. Namely, it is generally considered that when a material having both mountain-like portions and flat portions are introduced into a certain high temperature atmosphere, the temperature rise in the mountain-like portions will be 6 times as fast as the temperature rise in the flat portions. As a result, with the start of the laser light irradiation, the temperature will be increased suddenly and rapidly in the front portions of waved areas. When compared with the case in which laser light is caused to irradiate a flat smooth surface, the temperature in the waved areas can easily arrive at the boiling point of copper, thus causing the copper to be evaporated. In this way, since the copper material of the copper foil may be easily removed by using the carbon dioxide laser, it is possible to easily form holes in the resin substrate, thereby rendering it possible to attain the object of the present invention.

Furthermore, since each external copper foil of the copper clad laminate is made into a waved configuration, it is possible to improve the adhesion of an etching resist when the etching resist layer is directly formed on the copper foil. In general, a dry film coating and a liquid resist are used to form an etching resist layer. However, as a pretreatment, it is normally necessary to carry out a surface treatment to properly make the surface of a copper foil rough by virtue of chemical or physical polishing, it is not necessary to perform any other surface adjusting treatment.

Usually, after forming the etching resist layer and when the etching circuit pattern is exposed and then developed, there will be a phenomenon that the linearity of circuit edges will be damaged due to exposure problems. However, if an appropriate irregularity is formed on the surface of the external copper foils, like that in the copper clad laminate used in the present invention, exposure problems can be reduced and the linearity of an etching-treated circuit can be effectively increased, thereby proving to be extremely effective in forming a fine pitch circuit.

In fact, the present invention is so formed that after the copper clad laminate is manufactured, holes are formed in the laminate by using laser light, followed by a plating treatment to form an interlayer electrical connection. Subsequently, the above material is treated in a usual etching process, so as to be used for manufacturing a printed wiring board. For this reason, since it is not necessary to preliminarily in advance remove copper foil from areas being irradiated with a laser light, unlike the conformal mask method, it is possible to effectively reduce the production cost for manufacturing a printed wiring board.

Figure 4:
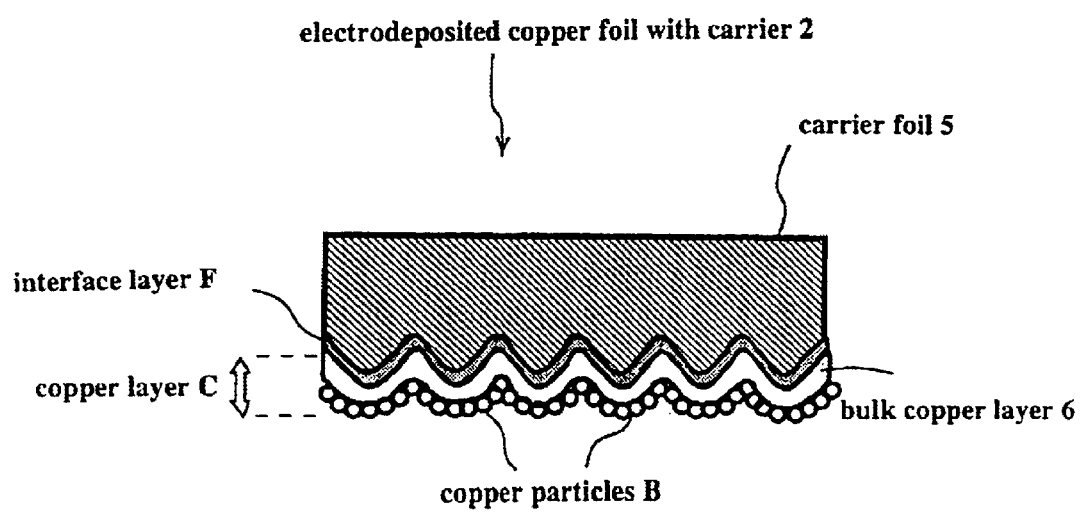
FIG. 4 is a schematic cross sectional view showing an electrodeposited copper foil with carrier.

When manufacturing a copper clad laminate for use in the present invention, it is extremely favorable to employ an electrodeposited copper foil with a carrier. In particular, it is preferred to use an electrodeposited copper foil as a carrier foil, to provide a copper foil layer which in turn forms an external copper layer of the copper clad laminate on the matte side of the copper foil, as shown in FIG. 4. In this way, the bulk layer of each electrodeposited copper foil will become into a state in which the rugged shape of the carrier foil has been transferred to the bulk copper, thereby efficiently producing the desired corrugated configuration. Further, since a copper clad laminate is laminated on to a prepreg with a carrier foil in manufacturing, the corrugated configuration is not collapsed during a pressing treatment, thereby ensuring the formation of a surface having a properly maintained rugged configuration. Here, so long a copper foil is an electrodeposited copper foil with a carrier, there is no limitation to their types. In other word, it is possible to use an etchable type capable of etching and thus moving the carrier foil or a peelable type capable of peeling and thus removing the carrier foil.

The printed wiring board manufacturing method has been proved more effective than the conventional conformal mask method, because the method of the present invention is able to effectively reduce the total cost for manufacturing a printed wiring board by using a carbon dioxide laser and at the same time to easily form a fine pitch circuit.

PREFERRED EMBODIMENT OF THE PRESENT INVENTION

In the following, a preferred embodiment of the present invention will be described in more detail to explain a method for manufacturing a printed wiring board, with reference to FIGS. 4 and 5(a)–(h) which are schematic crosssectional views showing a copper clad laminate 1. However, a hole forming test using laser light was conducted by virtue of a low pulse energy of 16 mJ, in order that some advantages and disadvantages of the hole formation process using laser light can be clearly understood. Here, laser irradiation conditions were set such that the frequency was 1000 Hz, the mask diameter was 5.0 mm, the pulse width was 60 $\mu$sec, the pulse energy was 16.0 mJ, the offset was 0.8, and the laser beam diameter was 140 $\mu$m, thus ensuring the formation of holes each having a diameter of 110 $\mu$m in the copper clad laminate. Therefore, as a qualification standard, when the holes formed during the laser abrasion had a diameter distribution in a range from 100 $\mu$m to 110 $\mu$m, the inventors of the present invention could determine that the result of laser abrasion was acceptable.

Figure 5A:
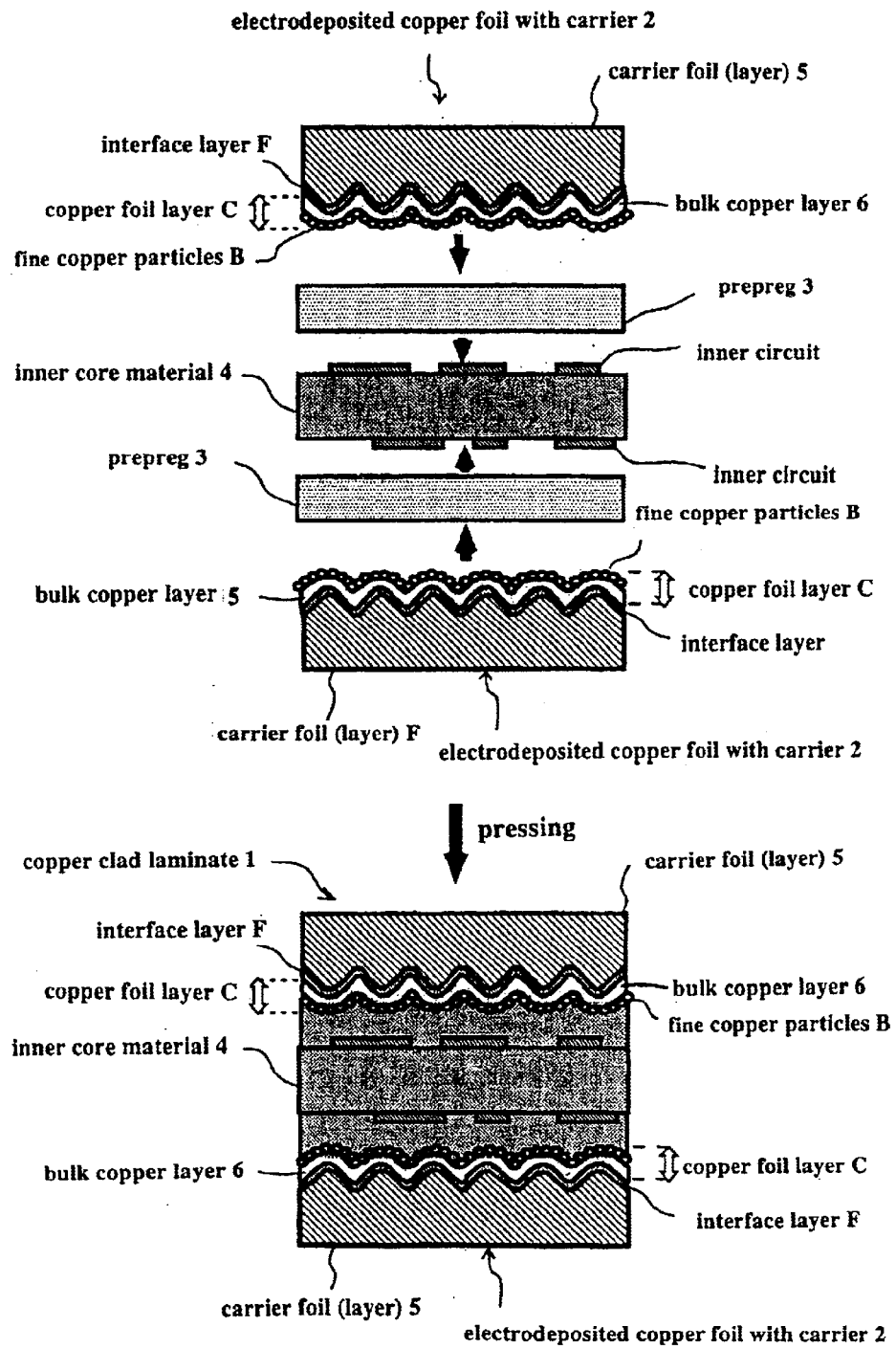
FIGS. 5(a)–(h) are schematic explanatory views showing a flow chart for manufacturing a printed wiring board.
Figure 5B:
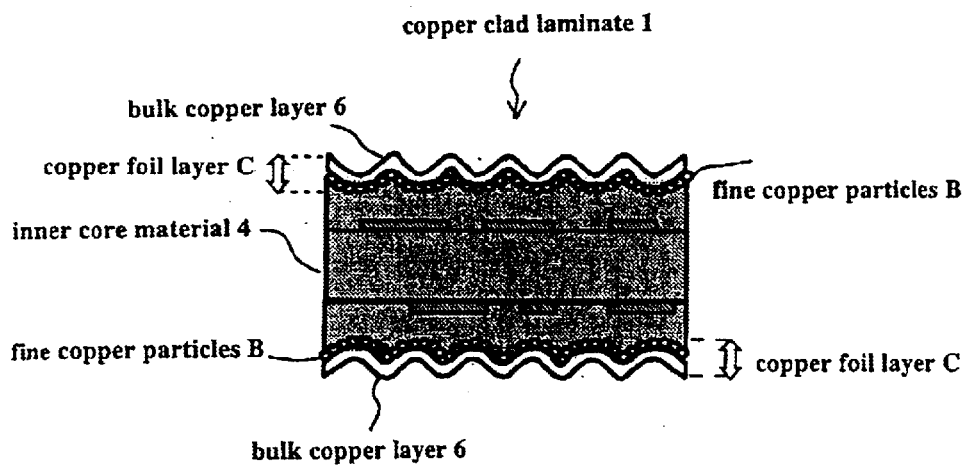
Figure 5C:
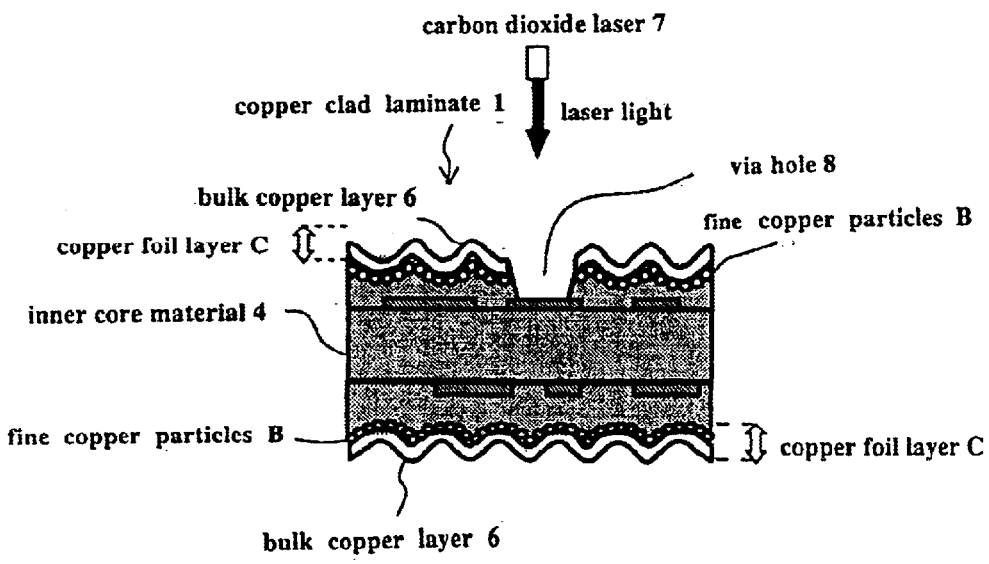

In the present embodiment, the copper clad laminate 1 was made of electrodeposited copper foils 2 with carrier, prepregs 3, a core material 4 serving as an inner layer, all of which were laminated together in a manner shown in FIG. 5(a). Then, a hot pressing was carried out to effect a desired formation. After the hot pressing, carrier foils 5 were removed, thereby obtaining a copper clad laminate 1 shown in FIG. 5(a).

Here, the electrodeposited copper foil 2 with carrier includes a peelable type material which can be used by removing the carrier foil 5. In fact, the electrodeposited copper foil 2 with carrier is comprised of the carrier foils 5, copper foil layers C, and combining interface layers F. Each combining interface layer F located on an interface between a carrier 5 and a copper layer C is an organic agent formed by carboxybenzo triazole (which can be simply referred to as CBTA). Each copper layer C is comprised of an amount of copper particles B and a bulk copper layer 6 serving as a conductor portion when a predetermined circuit is formed.

Once the carrier foils 5 were peeled off, the bulk copper layers 6 formed by waved copper foils appeared on the surfaces of the copper clad laminate. At this step, a carbon dioxide laser 7 was used to carry out a hole formation process using laser light. Then, the shape of each via hole 8 was formed in a manner shown in FIG. 5(c).

Figure 5D:
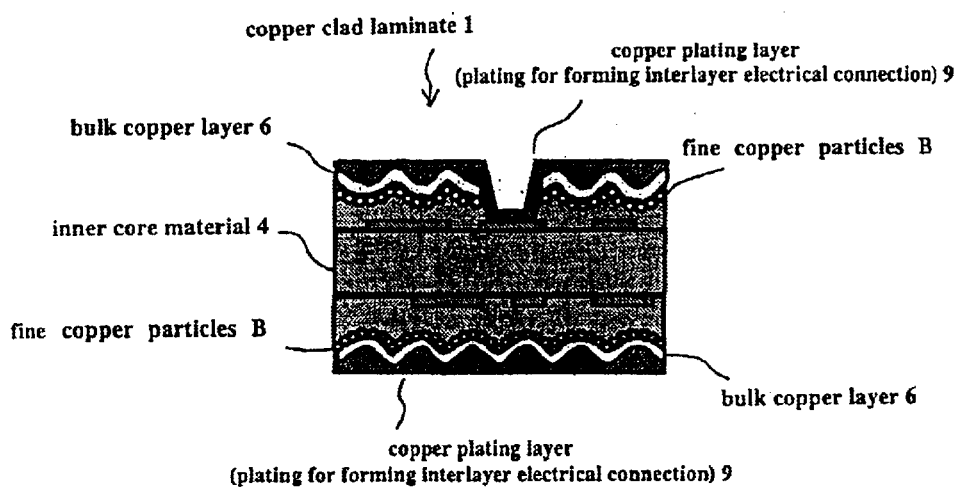
Figure 5E:
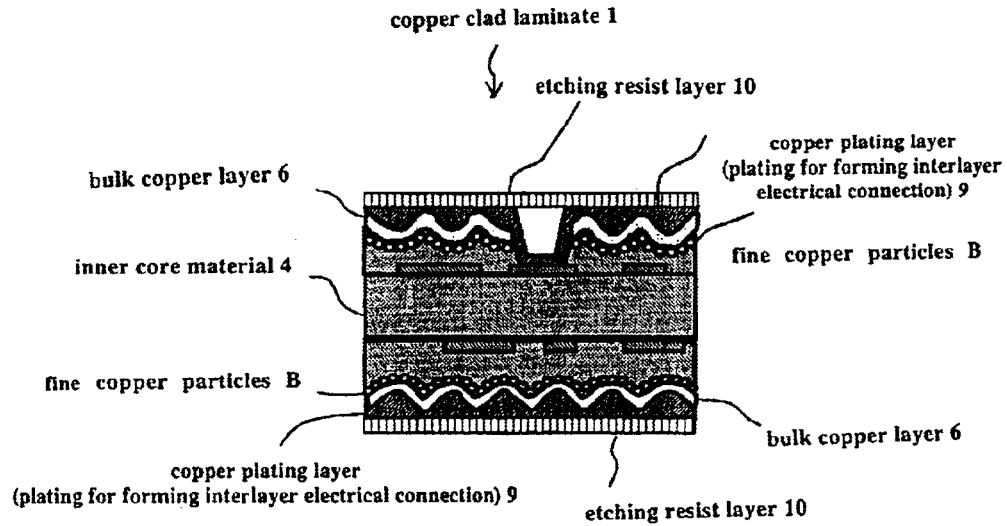
Figure 5F:
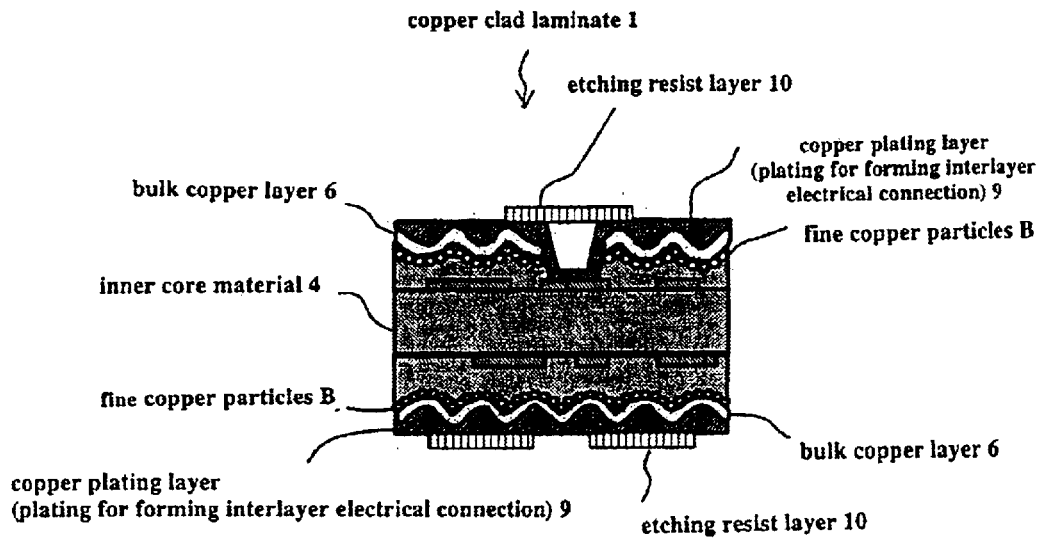
Figure 5G:
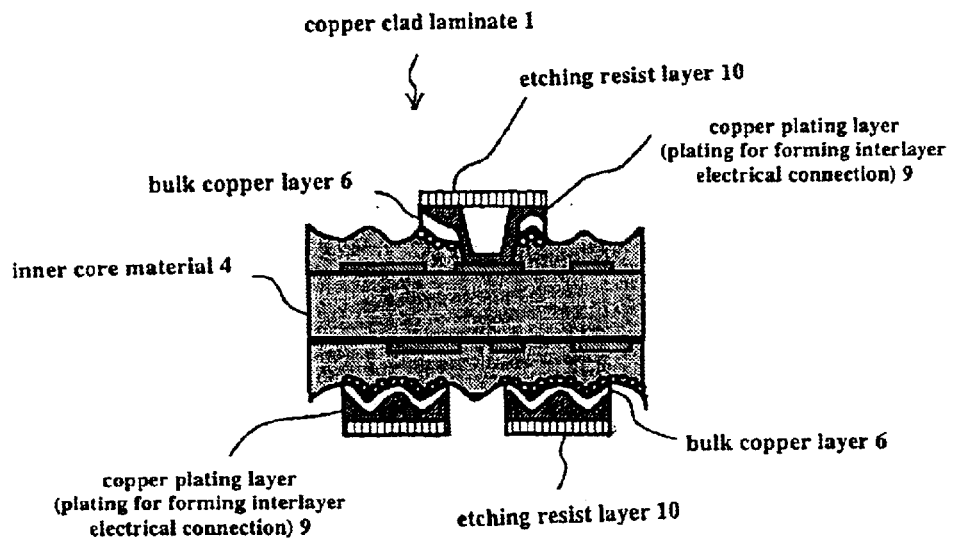
Figure 5H:
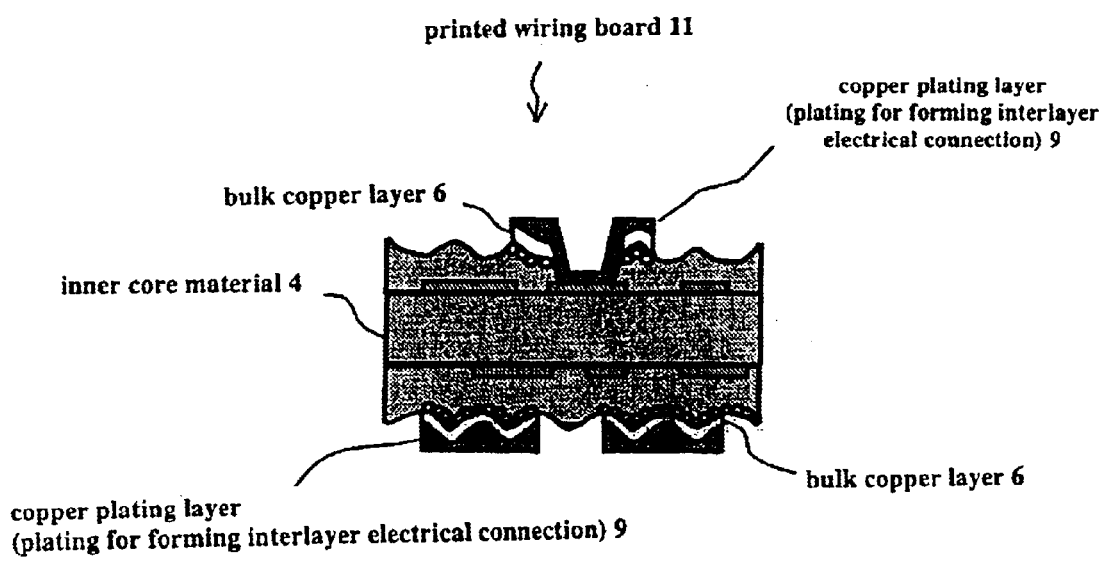

After forming the shape of each via hole 8, a treatment was carried out to form an interlayer electrical connection in a manner shown in FIG. 5(d). In fact, the treatment for forming the interlayer electrical connection was carried out by performing an electroless copper plating so as to form a copper layer having a thickness of 1 to 2 $\mu$m, followed by an electrolytic copper plating to form a copper layer 9 having a thickness of 10 $\mu$m. An electroless copper plating solution actually used was a commonly utilized solution including 0.06 mol/l of copper sulfate pentahydrate, 0.12 mol/l of EDTA·4Na, 0.5 mol/l of HCHO, 10 mg/l of 2,2'-dipyridyl, 250 mg/l of PEG1000, with a pH of 12.5 and a temperature of 70° C. The electroless copper plating was performed in a short time. After the electroless copper plating was completed, an electrolytic plating was performed using a copper sulfate solution containing free sulfuric acid (150 g/l) and copper (65 g/l), under a level plating condition in which the plating temperature was 45° C. and the current density was 15 A/dm$^2$, thereby obtaining a copper layer 9 having a thickness of 10 $\mu$m.

Subsequently, rinsing and a drying treatment were conducted. An ultraviolet-setting dry film was laminated on to the surface of each bulk copper layer 6 having a copper layer 9 formed thereon, thereby obtaining etching resist layers 10 in a manner shown in FIG. 5(*e*). Then, patterning films were attached to the etching resist layers 10, followed first by an exposure treatment and then by a development treatment, thereby retaining the etching resist layers 10 only in areas on which predetermined circuits were to be formed, in a manner shown in FIG. 5(*f*). Afterwards, a cupric chloride etchant was used to carry out an etching treatment, thereby forming circuits in a manner shown in FIG. 5(*g*). Finally, as shown in FIG. 5(*h*), a treatment for removing the etching resist layers 10 was conducted by using a sodium hydroxide solution, so as to wet remove the hardened etching resist layers 10, thus producing a printed wiring board 11.

EFFECT OF THE INVENTION

With the use of the method for manufacturing a printed wiring board according to the present invention, it has become possible to perform a hole formation process using laser light which is said to be difficult in the prior art, by virtue of irradiation using a carbon dioxide laser, as well as by virtue of simultaneous removal of a copper foil and a resin substrate. Therefore, using the printed wiring board manufacturing method of the present invention, conventional etching process can be employed, without having to peel off in advance the copper foils from areas which are treated by a laser light. Such a peeling is otherwise necessary in a conventional conformal method. Therefore, it has become possible to greatly reduce the cost for equipment investment, as well as the total cost for manufacturing a printed wiring board, thereby providing the market with lower-price products.

What is claimed is:

1. A method for manufacturing a printed wiring board, comprising the steps of: using a carbon dioxide laser to form recess via holes in external copper foils of a copper clad laminate; plating said copper clad laminate to form interlayer electrical connections; forming etching resist layers; exposing and developing the etching resist layers; and thereafter effecting a circuit etching treatment, wherein the copper clad laminate is a laminate formed by using waved copper foils having a surface roughness ($R_z$) of 2.0 to 20 $\mu$m exposed to said carbon dioxide laser as external copper foils.

2. A method for manufacturing a printed wiring board according to claim 1, wherein each waved copper foil for use in forming the external copper foils of the copper clad laminate includes a bulk copper layer forming a conductor circuit of the printed wiring board, an amount of fine copper particles for ensuring an adhesion strength between the bulk copper layer and a resin substrate, and a rust preventive layer, said bulk copper layer having a thickness of 18 $\mu$m or less.

3. A method for manufacturing a printed wiring board according to claim 1, wherein each of the waved copper foils has a surface roughness ($R_z$) of 10 to 20 $\mu$m.

4. A method of claim 1 wherein said waved external copper foils have the surface roughness of a carrier foil used in pressing said laminate.

* * * * *